United States Patent
Cox et al.

(10) Patent No.: US 7,721,241 B2
(45) Date of Patent: May 18, 2010

(54) AUTOMATED METHOD AND TOOL FOR DOCUMENTING A TRANSFORMER DESIGN

(75) Inventors: David N. Cox, Raleigh, NC (US); Thomas J. Lanoue, Cary, NC (US)

(73) Assignee: ABB Research Ltd., Zurich (CH)

( * ) Notice: Subject to any disclaimer, the term of this patent is extended or adjusted under 35 U.S.C. 154(b) by 1297 days.

(21) Appl. No.: 11/192,966

(22) Filed: Jul. 29, 2005

(65) Prior Publication Data

US 2007/0027883 A1    Feb. 1, 2007

(51) Int. Cl.
G06F 17/50    (2006.01)

(52) U.S. Cl. ............................................. 716/11; 716/1

(58) Field of Classification Search ............... 716/1, 716/11, 15, 200, 211, 234, 700; 707/100; 717/104, 106, 114, 115, 123, 131; 336/12, 336/15, 148, 149, 170, 180
See application file for complete search history.

(56) References Cited

U.S. PATENT DOCUMENTS

| | | | |
|---|---|---|---|
| 4,986,124 | A | 1/1991 | Byrne et al. |
| 5,197,120 | A | 3/1993 | Saxton et al. |
| 6,211,766 | B1 | 4/2001 | Goseberg et al. |
| 6,239,557 | B1 | 5/2001 | Chang et al. |
| 6,473,139 | B1 | 10/2002 | George |
| 6,516,451 | B1 | 2/2003 | Patin |
| 6,606,731 | B1 | 8/2003 | Baum et al. |
| 6,961,918 | B2 | 11/2005 | Garner et al. |
| 7,017,112 | B2 * | 3/2006 | Collie et al. ............... 715/212 |
| 7,263,672 | B2 | 8/2007 | Cox et al. |
| 7,409,666 | B2 * | 8/2008 | Almeida et al. ............... 716/15 |
| 2002/0120939 | A1 | 8/2002 | Wall et al. |
| 2002/0156929 | A1 | 10/2002 | Hekmatpour |
| 2004/0041812 | A1 | 3/2004 | Roberts et al. |
| 2004/0060014 | A1 | 3/2004 | Khalil |
| 2004/0172603 | A1 | 9/2004 | Collmeyer et al. |
| 2004/0207487 | A1 | 10/2004 | Hayashi |
| 2004/0243483 | A1 | 12/2004 | Baumann et al. |

(Continued)

FOREIGN PATENT DOCUMENTS

DE    1488356    4/1969

(Continued)

OTHER PUBLICATIONS

Michael Steurer, "The Impact of Inrush Currents on the Mechanical Stress of High Voltage Power Transformer Coils" by, IEEE Transaction on Power Delivery, vol. 17, No. 1, Jan. 2002, pp. 155-160.

(Continued)

*Primary Examiner*—Vuthe Siek
(74) *Attorney, Agent, or Firm*—Paul R. Katterle (57) ABSTRACT

A method and tool for creating documentation for a transformer design uses design files created during the transformer design process to generate drawings and other information necessary to populate documentation. The design files contain information relating to the physical layout of all of the components of the coil as well as the electrical connectivity of the windings. The method and tool retrieve the design information, construct the associated drawings, format the drawings to the appropriate sizes, and display any associated text.

15 Claims, 8 Drawing Sheets

U.S. PATENT DOCUMENTS

| | | | |
|---|---|---|---|
| 2005/0080502 A1 | 4/2005 | Chernyak et al. | |
| 2005/0096772 A1 | 5/2005 | Cox et al. | |
| 2005/0096886 A1 | 5/2005 | Smiley et al. | |
| 2005/0193361 A1 | 9/2005 | Vitanov et al. | |
| 2005/0278670 A1 | 12/2005 | Brooks et al. | |
| 2005/0289484 A1 | 12/2005 | Whitefoot et al. | |
| 2006/0053398 A1 | 3/2006 | Cox et al. | |
| 2006/0064667 A1* | 3/2006 | Freitas | 717/104 |
| 2006/0085781 A1 | 4/2006 | Rapp et al. | |
| 2006/0178864 A1 | 8/2006 | Khanijo et al. | |
| 2007/0027883 A1 | 2/2007 | Cox et al. | |
| 2007/0234263 A1 | 10/2007 | Cox et al. | |
| 2007/0283309 A1 | 12/2007 | Cox et al. | |

FOREIGN PATENT DOCUMENTS

| | | |
|---|---|---|
| EP | 0991092 | 4/2000 |
| WO | PCT2006029519 | 2/2007 |

OTHER PUBLICATIONS

Marino et al., ; "Creating an Abstraction of Sensors to Ease Usage, Distribution and Management of a Measurement Network"; Sep. 16-19, 2003; Emerging Technologies and Factory Automation.

Van Renssen A: "Gellish: an information representation language, knowledge base and ontology" Standardization and Innovation in Information Technology, 2003. The 3rd Conference on Oct. 22-24, 2003, Piscataway, NJ, USA, IEEE, Oct. 22, 2003, pp. 215-228, XP010672921 ISBN:0-7803-8172-6 abstract p. 222, paragraph 1.

Anderl R et al Association for Computing Machinery: "Parametric Design and Its Impact On Solid Modeling Applications" Proceedings of the Third Symposium on Solid Modeling And Applications. Salt Lake City, May 17-19, 1995, Proceedings Of The Symposium On Solid Modeling And Applications, New York, ACM, US, vol. SYMP. 3, May 17, 1995 pp. 1-12, XP000530104 ISBN: 0897916727 Sections 4.2, 4.3.

Mok C K et al: "An Interactive Knowledge-based CAD system for mould design in injection moulding processes" International Journal of Advanced Manufacturing Technology, Springer Verlag, London, GB, vol. 17, No. 1, 2001, pp. 27-38, XP002273785 ISSN: 0268-3768 abstract.

Liggett R S: Automated Facilities Layout: past, present and future Automation in Construction, Elsevier Science Publishers, Amsterdam, NL, vol. 9, No. 2, Mar. 2000 pp. 197-215, XP004220759 ISSN: 0926-5805 introduction.

Chao C Chen et al: "The Layout Synthesizer: An Automatic Netlist-To-Layout System" Proceedings Of The Design Automation Conference. Las Vegas, Jun. 25-29, 1989, Proceedings Of The Design Automation Conference (DAC), New York, IEEE, US,vol. CONF. 26, Jun. 25, 1989, pp. 232-238, XP000145793 ISBN: 0-89791-310-8 introduction.

Ismail N et al: "Ruled-based feature extraction and recognition from STEP file" Research and Development, 2002, Scored 2002. Student Conference on Jul. 16-17, 2002, Piscataway, NJ, USA, IEEE, Jul. 16, 2002, pp. 90-93, XP010603479 ISBN: 0-7803-7565-3 the whole document.

* cited by examiner

AUTOMATED METHOD AND TOOL FOR DOCUMENTING A TRANSFORMER DESIGN

FIELD OF THE INVENTION

The present invention relates to a transformer, and more particularly, to the automated documenting of a transformer design.

BACKGROUND OF THE INVENTION

Voltage transformers are used to convert electrical energy from one voltage potential to another voltage potential. Transformers range from small 120VAC to 220VAC converters to large power transformers used to convert voltages from 1 kV (kilovolt) to 1000 kV or higher. Additionally, transformers may also be categorized as standard versus non-standard transformers. Standard transformers are those transformers having non-unique designs manufactured in large quantities. Unique or non-standard transformers are typically designed and manufactured individually.

Current design and manufacturing procedures used to build unique transformers utilize a manual documentation generation process. This manual process often results in errors in the documentation associated with the manufacture of the transformer. Such errors can create a problem in the transformer manufactured using that documentation. If the transformer is not manufactured correctly and does not conform to the particular design specifications, additional equipment within the power distribution network connected to this transformer may be adversely affected. The present invention provides an alternative to the manual documentation process. The present invention overcomes any errors associated with manually generated documentation by creating an automatic documentation process.

The voltage transformer has two main pieces, the core and the coil. The core is made from materials such as steel or iron. The core may have a single leg or multiple legs depending on the type of transformer. The legs are connected together by yokes and the connection between the legs and the yokes create a closed magnetic circuit. A stacked transformer core is formed by stacking layers of grain oriented steel sheets on top of one another. Alternatively, in a wound transformer core the sheets of steel are wrapped around the coil.

The coil of a transformer consists of conductive material wound around the leg(s) of the core. In its simplest form the coil of a transformer has a single primary winding and a single secondary winding. The primary winding is connected to the source of power (typically AC) and the secondary winding is connected to the load. As current flows through the primary winding, a resultant magnetic field within the core causes a current to be formed in the secondary winding of the coil.

Transformers are manufactured to conform to various customer requirements. Depending on the application, the utility company may need a transformer with a unique kVA rating that fits a particular footprint. The transformer manufacturer takes the customer input and designs a transformer to meet the requirements. When designing the transformer, the manufacturer tries to create a design that not only meets the customer requirements, but does so in a cost effective manner.

In order to create a cost effective design and manufacturing flow, the transformer manufacturer automates as much of the process as possible. Automated tools may be developed to assist with the design flow as well as the manufacturing flow. For example, instead of manually calculating the number of turns required for the low voltage winding, a computer program is used to perform this function. In addition, graphical displays may be developed to assist the transformer designer in creating the design.

The present invention is designed to further automate the transformer design process, by eliminating the manual steps previously performed to generate the manufacturing specifications and supporting documents. The present invention links to other processes within the transformer design flow, extracts the documentation information, and deposits it in a file. The end result is a file populated with all of the information necessary to document and build the transformer.

SUMMARY OF THE INVENTION

An automated method of documenting a transformer design, the method comprising
  a) generating an electronic file comprising transformer design information,
  b) analyzing the electronic file,
  c) creating a drawing from the transformer design information,
  d) exporting the drawing into a document.

An automated method of designing a transformer, the method comprising
  a) generating a file comprising a hierarchical data model of said transformer design;
  b) reading the file;
  c) analyzing the file;
  d) opening a document;
  e) inserting a drawing into said document, said drawing constructed from said hierarchical data model.

A computer readable media containing computer code instructing a processor to:
  a) generate an electronic file comprising transformer design information,
  b) analyze said electronic file,
  c) create a drawing from said transformer design information,
  d) export said drawing into a document

BRIEF DESCRIPTION OF THE DRAWINGS

The invention is further described in the detailed description that follows, by reference to the noted drawings, by way of non-limiting illustrative embodiments of the invention, in which like reference numerals represent similar elements throughout the several views of the drawings, and wherein.

DETAILED DESCRIPTION OF ILLUSTRATIVE EMBODIMENTS

Figure 1:
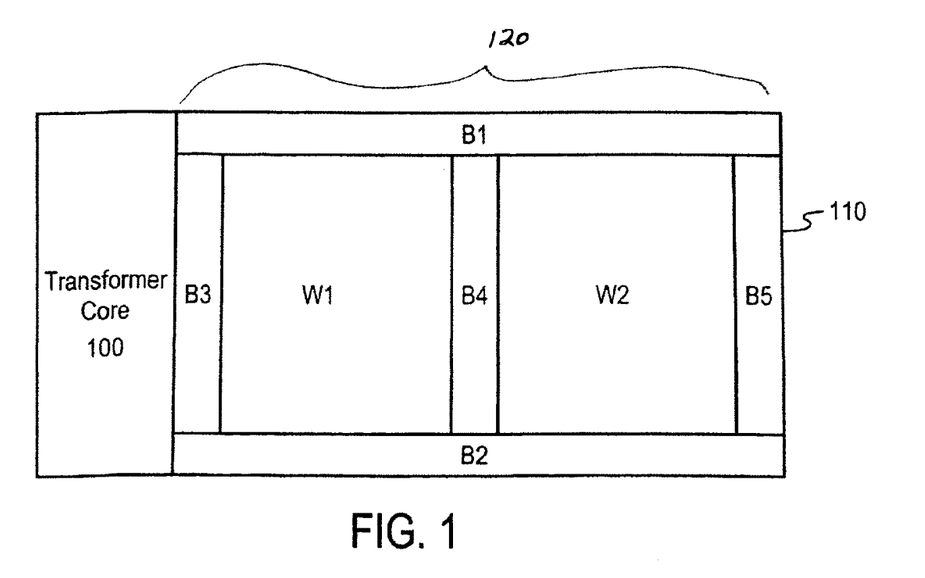
FIG. 1 illustrates cross sectional view of a transformer.

The present application incorporates by reference U.S. patent application Ser. No. 10/933,535 ("the '535 application") in its entirety. A geometrical layout of a cross section of a transformer is shown in FIG. 1, which, except for reference numeral 120, is identical to FIG. 1 of the '535 application. The transformer includes a core 100 and a winding section 120. The winding section 120 includes barriers B1-B5 and windings W1-W2. The barriers B1-B5 insulate windings W1-W2 from each other and include insulating materials, such as resin, electrical glass, paper, and the like.

The physical layout of the barriers B1-B5 and windings W1-W2 can be described using the hierarchical data model described in the '535 application and is repeated herein in this and the next few paragraphs. The data model includes an abstract component called a block to arrange barriers and windings either horizontally or vertically. A block can be either a horizontal block or a vertical block. A block can also include sub-blocks. For example, in FIG. 1, block 110 includes barrier B3, winding W1, barrier B4, winding W2, and barrier B5. The sub-blocks in a horizontal block are arranged horizontally. The sub-blocks in a vertical block are arranged vertically. A block can contain barriers, windings, and sub-blocks.

The physical layout in FIG. 1 can be defined using the following general hierarchical data model:

```
            vertical block
              barrier B1
              horizontal block 110
                barrier B3
                winding W1
                barrier B4
                winding W2
                barrier B5
```

Barrier B2

The vertical block defines the entire physical layout. The horizontal block 110 defines the middle section of the physical layout between the top and bottom barriers. Because blocks can contain sub-blocks any physical layout can be described using a hierarchical data model. Any metadata created to describe this physical layout must reflect this data model and its hierarchical nature.

A data model for defining a geometry of a physical layout of the electrical device of FIG. 1 as blocks and sub-blocks using XML (extensible Markup Language), a metadata markup language, is shown below:

Example 1

```
<physicalLayout layout="vertical">
    <barrier name="B1" />
    <block layout="horizontal">
      <barrier name="B3" />
      <winding="W1" />
        <property name="DESCRIPTION" type="TEXT"
        value="L V WINDING " />
      <barrier name="B4"/>
```

-continued

```
      <winding="W2"/>
        <property name="DESCRIPTION" type="TEXT"
        value="H V WINDING " />
      <barrier name="B5" />
    </block>
    <barrier name="B2" />
</physicalLayout>
```

The data model includes a metadata element for each block and a metadata element (referred to herein as a child metadata element) for each sub-block associated with a respective block. Within the metadata elements are tags used by software code to interpret the information contained in the element. Interpretation of the metadata information describing each element is described in greater detail in subsequent paragraphs.

The metadata elements are arranged in a hierarchical format. For example, indented under the metadata element <block layout="horizontal"> are the child metadata elements for barrier B3, winding W1, barrier B4, winding W2, and barrier B5, in that order, as shown in FIG. 1. Each child metadata element is positioned in the data model between a start tag and an end tag of the metadata element.

Figure 2:
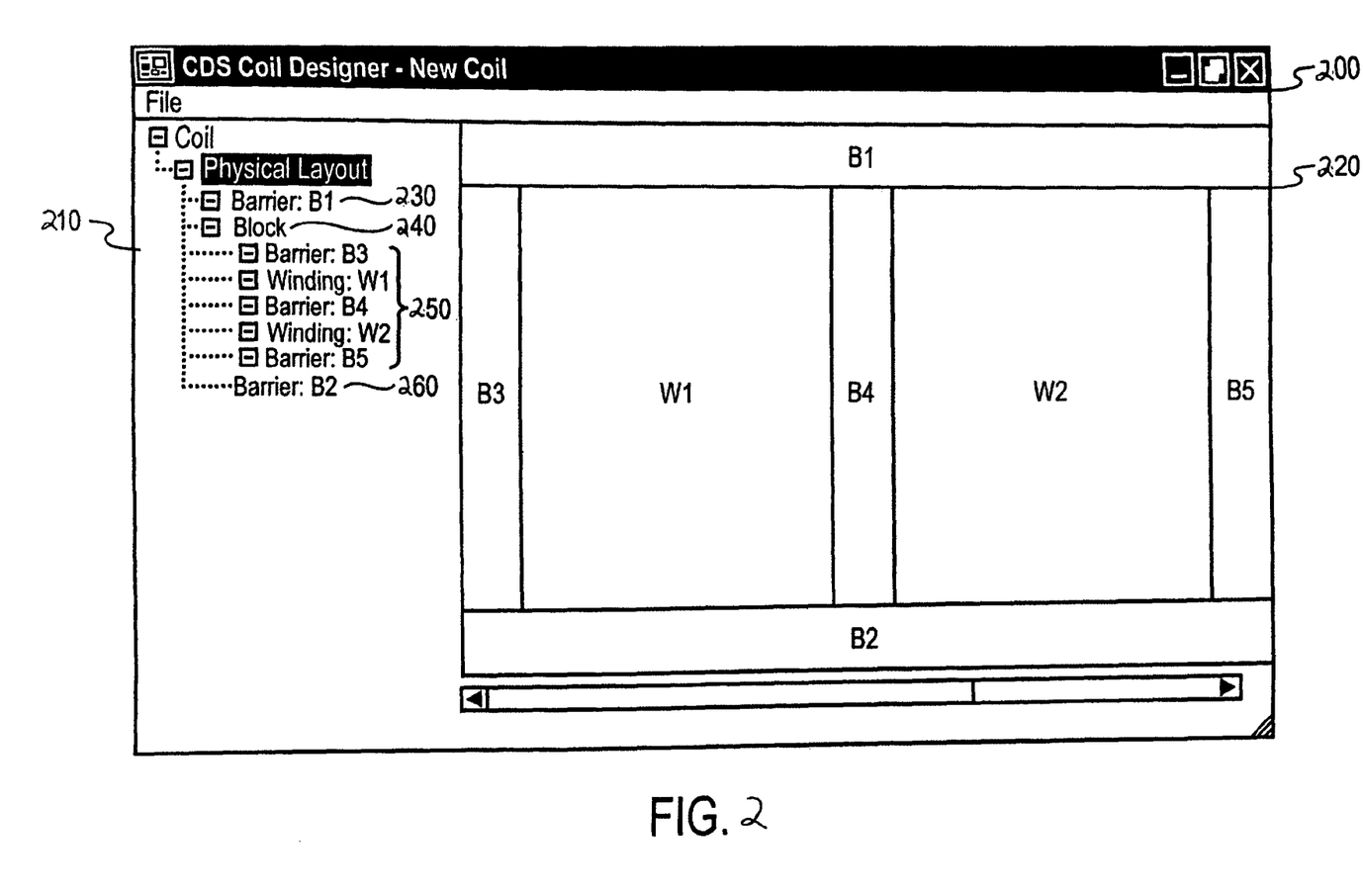
FIG. 2 illustrates a screenshot of a GUI of a transformer software design tool.

FIG. 2, is identical to FIG. 3 of the '535 application aside from the numbering of the elements. FIG. 2 of the present application shows a computer graphics window 200 that illustrates a graphical user interface (GUI) for creating a metadata text file corresponding to the geometry of a physical layout of a transformer coil. The window 200 is displayed on a computer accessed by a user. The computer may be a laptop or desktop running either in a network configuration or in a stand alone environment. In the left pane 210 of the window 200 is a tree view that shows a hierarchy of block identifiers. The right pane 220 shows a graphical representation of the physical layout.

Initially, the left pane 210 contains only a single block, called "Physical Layout," and the right pane 220 contains no barriers, windings, or blocks. As a user adds block identifiers in the left pane 210, the associated blocks are displayed in the right pane 220. The block identifiers are positioned sequentially according to the geometry of the physical layout. When the block contains a sub-block, a sub-block identifier representing the sub-block is added. For example, B3, W1, B4, W2, and B5 are sub-block identifiers. They are collectively identified in left pane 210 by 250. The sub-block identifier is positioned sequentially in the left pane 210 according to the geometry of the physical layout within the block, in this case, left-to-right. Each block or sub-block can have characteristics (e.g., shape which, in an exemplary embodiment, can be assumed to be a particular shape, such as rectangle, position, orientation and size) stored in a file that is accessed by a drop down menu (not shown) when a block or sub-block is selected by a user. The corresponding file is accessed from the memory of the computer to render an image of the block or sub-block in the pane 220.

Additional information relating to the blocks may also be entered using the drop down menu in the left pane 210 of the GUI. For example, winding W1 may be assigned a unique name such as "L V Winding." This is reflected in Example #1 as "<property name="DESCRIPTION" type="TEXT" value="L V WINDING " />. Other information such as the winding type, the conductor type, the barrier type and so forth may be added to the design via the drop down menu. The metadata file is updated as each of these properties is added to the transformer design.

The associated metadata text file is saved by the transformer design program. This occurs when the user launches a command (not shown in FIG. 2) within the user interface, e.g., selects a file menu command, to save the metadata text file. Alternatively, the metadata file is saved automatically by the transformer design program when the last component is added, and the file is closed.

Figure 3:
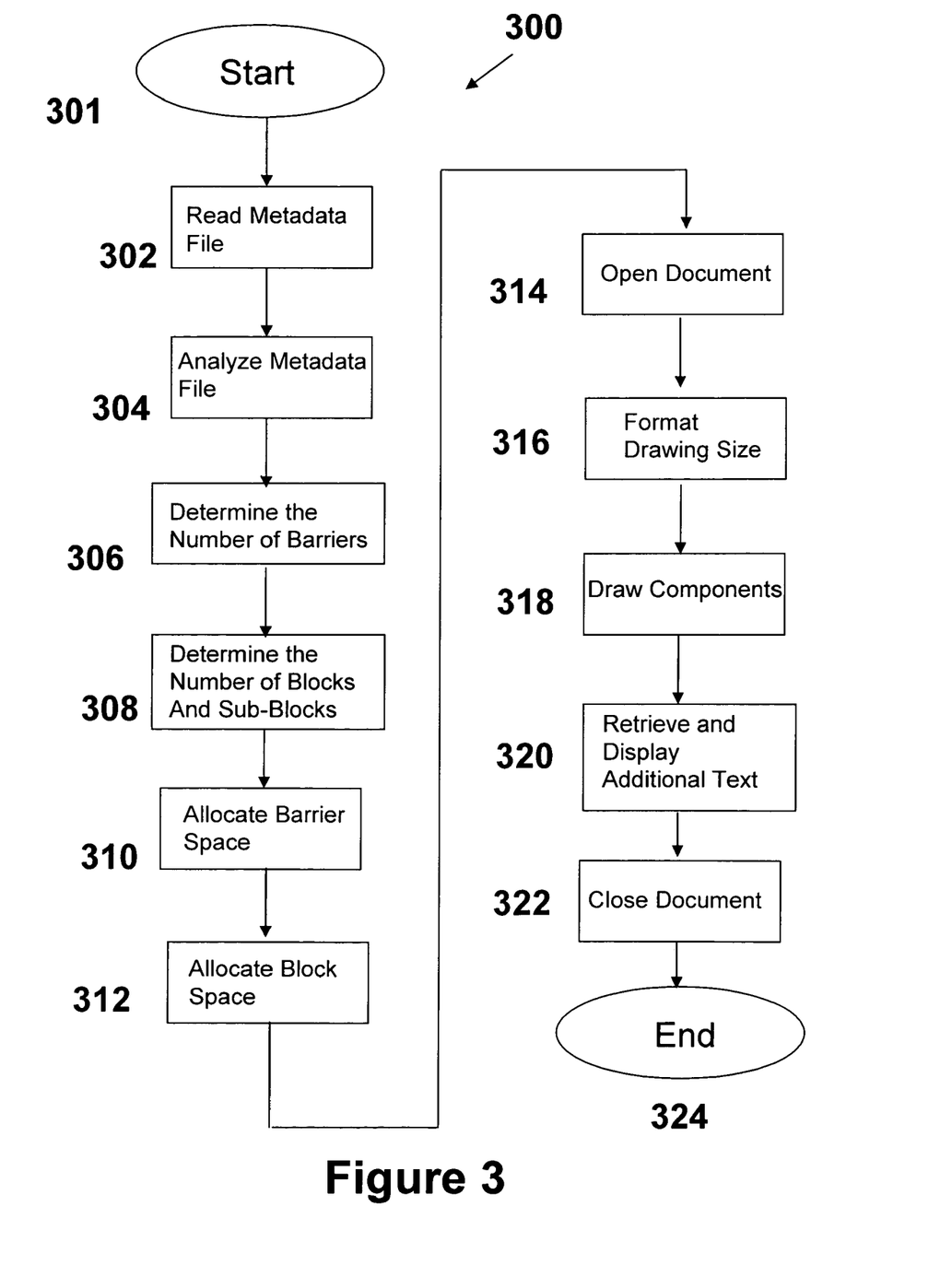
FIG. 3 shows a flow chart outlining a physical design software process in accordance with one embodiment of the present invention.
Figure 4:
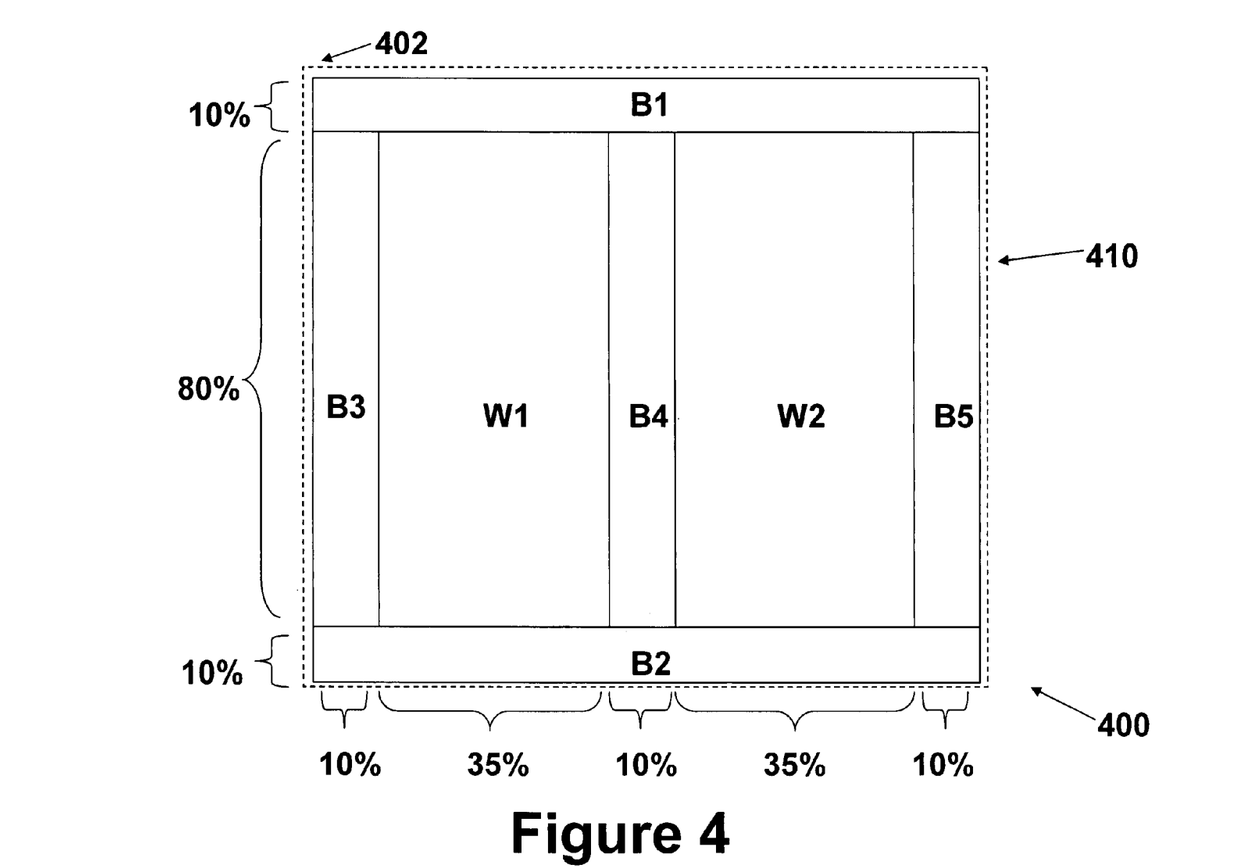
FIG. 4 illustrates a drawing of a physical layout of a transformer created by the present invention.

When the user determines that the design of the physical layout is complete and wants to generate a manufacturing document, the user selects a command in the GUI (not shown). The command automatically generates the manufacturing documentation reflecting the physical layout of the transformer coil. The manufacturing documentation is used by manufacturing personnel to assemble the coil. Ideally, the manufacturing documentation reflects the image of the physical layout shown in the right pane 220 of the window 200. In one embodiment of the present invention, a software routine creates the physical layout documentation. A flow chart outlining the steps performed by the physical layout software routine 300, which is stored on computer readable media and runs on the user's computer, is shown in FIG. 3. Using the data from the metadata file, the software routine 300 automatically creates a document populated with the transformer physical design information. The document includes drawing figures and text. An exemplary drawing 400 created by the present invention and inserted into the document is shown in FIG. 4. In this embodiment, the software routine 300 places the drawing 400 and associated text into the document in predefined locations.

The automatic creation of a document populated with transformer design information begins with step 301 in FIG. 3. The next step 302 in the software routine 300 is reading the metadata file. For demonstrative purposes, the metadata file of Example #1 is read in the software routine 300. As the software routine 300 reads the metadata file in step 302, it also analyzes the elements within the file as shown in step 304.

Within step 304, the software routine 300 extracts functional and relational information from the metadata file. Referring to Example #1, the metadata element "<physicalLayout layout=vertical>" identifies that this particular metadata file (Example #1) is to be used to generate the drawing 400 of the physical layout of the transformer coil. Additionally, the metadata element contains two pieces of information. The first piece "physicalLayout" identifies that any information following this tag contained within the brackets "< >" provides orientation information for the physical layout. The second part, "layout=vertical" defines that any subsequent elements are to be stacked vertically.

In step 306, the software routine 300 determines the total number of horizontal barriers. In Example #1, there are two horizontal barriers, B1 and B2. Next in step 308, the software routine 300 determines the number of blocks, the number of sub-blocks within the blocks, the number of sub-blocks within the sub-blocks and so forth. For Example #1, the software routine determines that there is one block (240 of FIG. 2) consisting of five sub-blocks, B3, W1, B4, W2 and B5, respectively.

After the number of horizontal barriers, blocks and sub-blocks are determined, the software routine 300 allocates space for each of the pieces. In the present invention, the software routine 300 is programmed to display the components using actual assembled proportions. For example, when assembled, each of the horizontal barriers B1, B2 of the coil described in FIG. 2 is roughly 10% of the height of the coil. Based on this design of the coil, the software routine 300 is programmed to allocate a total of 20% of the available vertical display for the horizontal barriers B1, B2. Since there are only two barriers B1 and B2 in Example #1, they are each allocated 10% of the available vertical display space in step 310 as shown in FIG. 4. The remaining 80% of the vertical display is allocated to display the blocks and sub-blocks.

In step 308, the software routine 300 determined that there are two windings W1 and W2 and three barriers B3, B4 and B5 in the block 240. Based on this configuration of the block and sub-blocks, the software routine 300 assigns 10% of the available horizontal display to each of the barriers (B3, B4 and B5) and 35% of the horizontal display to each of the windings (W1 and W2) in step 312 (also illustrated in FIG. 4). Similar to the space allocation for the horizontal barriers (B1, B2), the percentages assigned for the block and sub-blocks are preprogrammed into the software routine 300 based on the actual design. The percentages correspond to the actual physical dimensions of the block pieces when fully assembled.

In step 314, the software routine 300 opens a document that will be populated with the drawing 400 and associated text. For example, the document may be a Word™ document, an Excel™ document, a Word Perfect™ document or a Power Point™ document. After the document is opened, the software routine 300 determines in step 316 how large to make the drawing. The software routine 300 is programmed to vary the size of the drawing based on the format of the document the drawing is exported into. For example, the drawing may be formatted to fit into a 400×400 pixel ActiveX window if it is imported into an 8½"×11" portrait oriented document. Those skilled in the art appreciate that the use of an ActiveX window to import information into a document is common in the software application industry. In FIG. 4, the dotted line 410 surrounding the drawing 400 shows the ActiveX display window.

After the drawing size is determined, in step 318, the software routine 300 creates the drawing 400 in the ActiveX window. The software routine 300 starts at a reference point in the top left corner 402 of the window 400 and draws the blocks. For the metadata file of Example #1, a rectangular box comprising 10% of the vertical display and 100% of the horizontal display is drawn representing the first barrier layer B1. Once the box for B1 is drawn, the label "B1" is inserted in the box. The software routine 300 then draws the horizontal block comprising the five sub-blocks (B3, W1, B4, W2, and B5) according to the determined percentages as previously described in steps 310 and 312. The block 240 is drawn in the following order: barrier layer B3, winding W1, barrier layer B4, winding W2 and barrier B5. After each sub-block is drawn, the software inserts the appropriate label into the respective section. The software then draws the last barrier B2, inserts the label "B2" and closes the ActiveX window. The drawing is complete. The drawing 400 reflects the GUI representation as shown in the right pane 230 of FIG. 2.

After the drawing is completed in step 318, the software routine 300 retrieves any additional textual information embedded within the metadata file in step 320. Examples of text stored within the metadata file include, but are not limited to, barrier or winding names, electrical tolerances, insulation characteristics, and so forth. Once extracted from the metadata file, this information is inserted into the document in predetermined locations. Once all of the information is inserted into the document, the document is closed in step 322 and the software routine ends at step 324.

Figure 5:
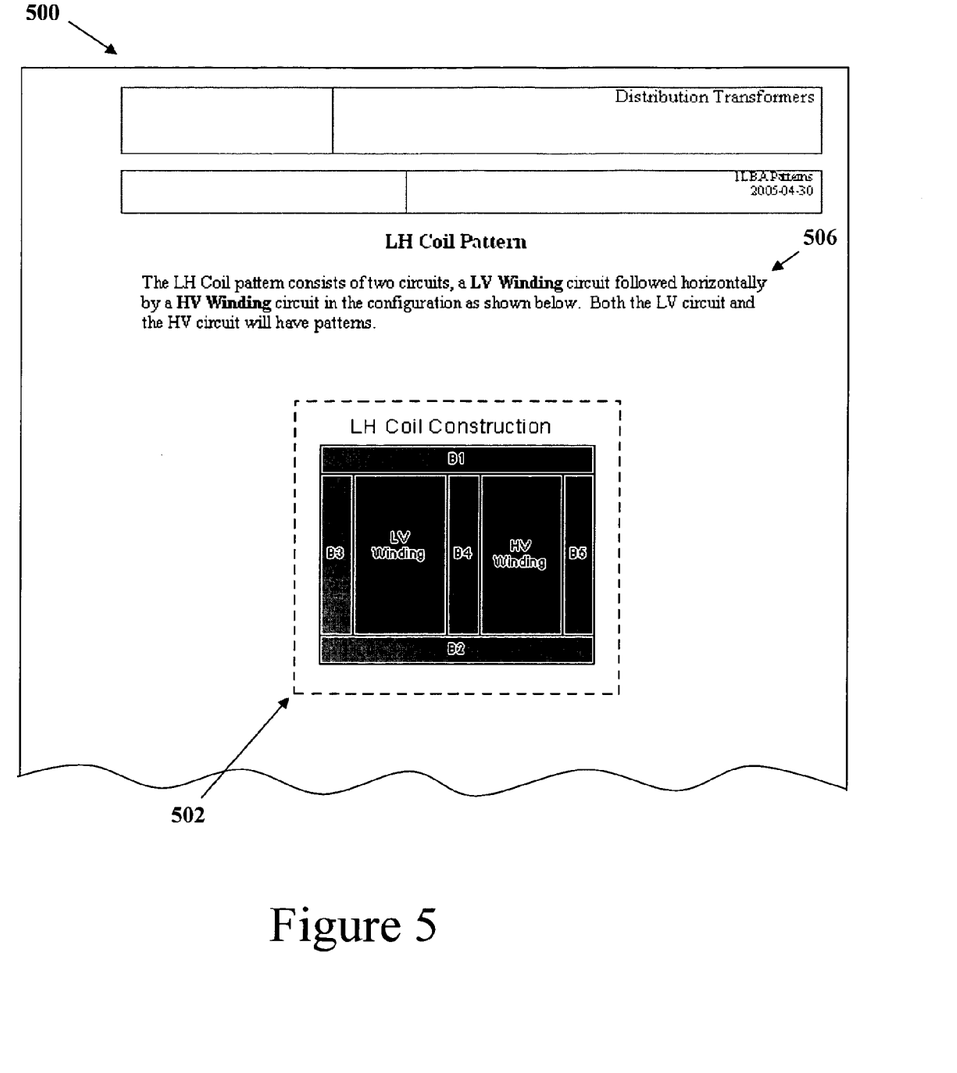
FIG. 5 illustrates a document populated with the physical design information of a transformer coil.

An example page 500 of a document automatically populated with transformer physical design information is shown in FIG. 5. The page 500 has a transformer drawing 502, and associated text section 506. In this embodiment, the associated text 506 describes the characteristics of the individual pieces of the coil. The transformer drawing 502 is substantially similar to the image displayed to the user in the right pane 220 of the computer graphics window 200 of FIG. 2, except that in FIG. 5 the LV and HV windings, are identified by the unique name assigned by the user. In addition to the drawing 502, the text "L V WINDING" and "H V WINDING" is extracted and inserted into the text section 506 of the page 500 describing each of the windings of the coil. For ease of illustration, the inserted text is shown in BOLD in the text section 506.

In another embodiment of the present invention, documentation relating to the electrical connectivity of the transformer is automatically generated. When describing a hierarchical model for the electrical connectivity of the coil, the top of the hierarchy is the entire circuit layout for the coil. The next level of hierarchy consists of the windings and the circuits. Under the hierarchy of the windings are the segments and below the segments are the start lead and the finish lead. Under the hierarchy of the circuits are the nodes. Below each node is the source and destination of the node.

The present invention extracts the connectivity information from a metadata file corresponding to the transformer electrical design and populates a document with both drawing figures and textual information. An example of such a metadata file is shown below:

Example #2

```
<CircuitLayout name="LV1">
    <Winding name="Winding 1">
        <Segment name="S1">
            <StartLead name="s"/>
            <FinishLead name="f"/>
        </Segment>
    </Winding>
    <Circuit name="C1">
        <Node name="N1">
            <Src Winding="Winding 1" Segment="S1" Lead="s" />
        <Node name="N2">
            <Dst Winding="Winding 1" Segment="S1" Lead="f" />
        </Node>
    </Circuit>
</CircuitLayout>
```

For ease of explanation, the circuit description of Example #2 contains only the description of a single low voltage winding. The low voltage winding of Example #2 can be the low voltage winding of a single phase transformer or one of the three low voltage windings of a three phase transformer. If a three phase transformer were described in a metadata file, there would be a low voltage winding entry for each phase. There would also be associated entries for the segments and circuits for each low voltage winding for each phase.

In Example #2, Winding 1 is defined as consisting of segment S1 that has a start lead s and a finish lead f. A winding may have multiple segments, but for ease of illustration, only one segment is described in Example #2. The connectivity of the segment S1 is defined under the circuit description. The circuit C1 associated with Winding 1 has two nodes N1 and N2. Node N1 is defined as the source for segment S1 and is connected to start lead s. Node N2 is defined as the destination and is connected to the finish lead f of segment S1.

The XML file of Example #2 may be generated using a transformer design tool similar to the physical layout tool shown in the previously described FIG. 2. The transformer design tool generates the metadata file after the electrical circuit design has been completed. Alternatively, a designer could design the electrical circuit for the transformer coil by manually creating a metadata file describing the circuit. Once the metadata file is created, the present invention uses the information within the metadata file to automatically generate the associated electrical circuit documentation.

Figure 6:
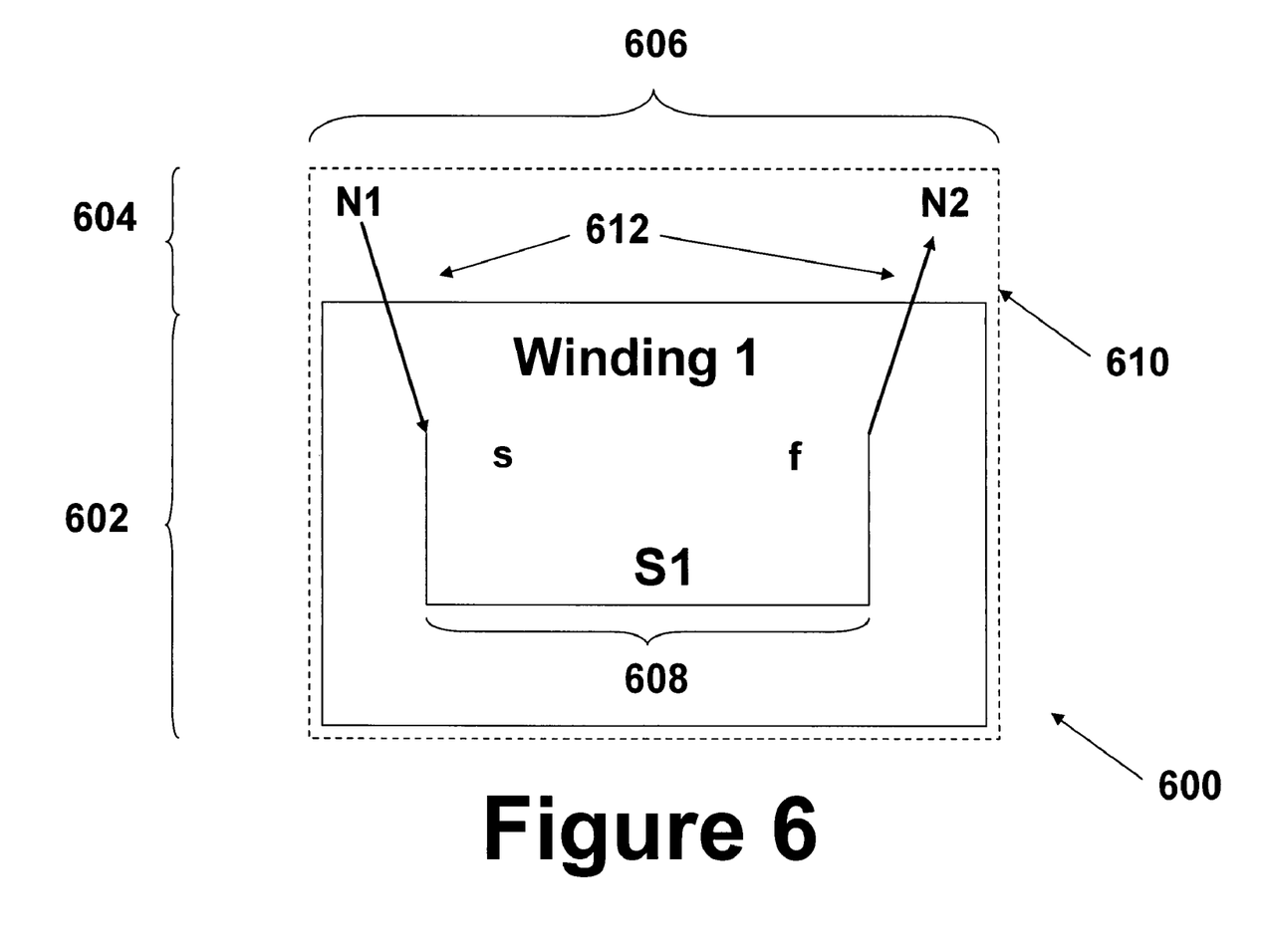
FIG. 6 illustrates a drawing of an electrical circuit of a coil of a transformer created by the present invention.

FIG. 6 is an exemplary electrical circuit drawing 600 of the low voltage winding, created by one embodiment of the present invention, using the metadata file of Example #2. The drawing 600 shows the various components and orientation of Winding 1. The dotted line surrounding the drawing 600 depicts the boundaries of an ActiveX window 610, in which the drawing 600 is created. The process implemented by the present invention in creating the drawing 600 is explained below.

Figure 7:
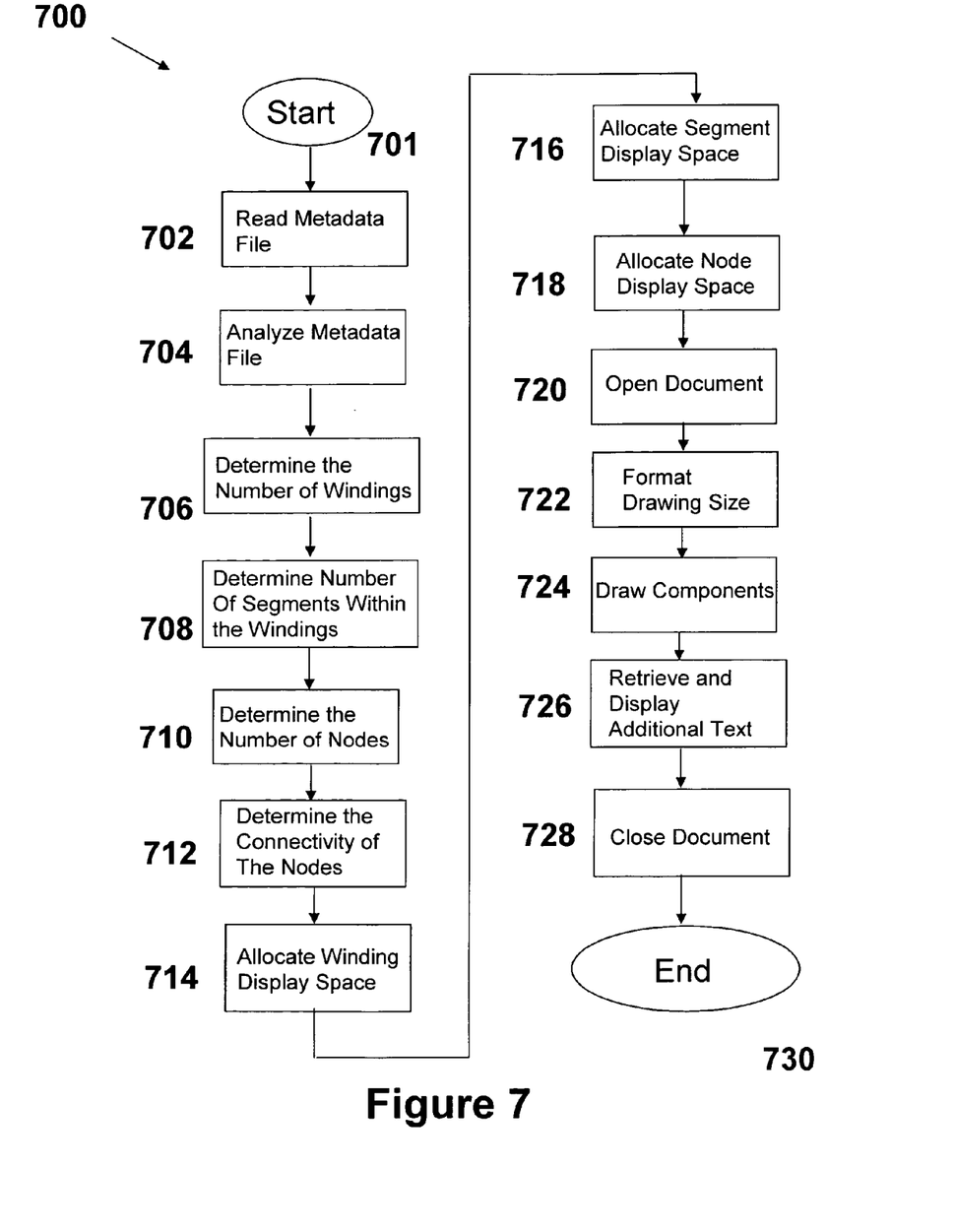
FIG. 7 shows a flow chart outlining an electrical design software process in accordance with another embodiment of the present invention.

The present invention utilizes an electrical layout software routine similar to the physical layout software routine 300 described in FIG. 3. A flow chart describing the electrical layout software routine 700 is shown in FIG. 7. The software routine 700 is stored on computer readable media and uses the electrical circuit metadata file, in this case Example #2, to create the drawing 600 of FIG. 6.

Referring to FIG. 7, in steps 701 through 704 the software routine 700 reads and analyzes the metadata file (Example #2) similar to the corresponding steps in FIG. 3. In Step 706, the software routine 700 determines the number of windings in the circuit from the metadata information. After determining the number of windings, the software routine 700 determines the number of segments in each winding in step 708. In step 710, the software routine 700 determines the number of nodes in the circuit. For Example #2, there is one winding (Winding 1), one segment (S1) and two nodes (N1, N2).

After the software routine 700 has determined the number of elements in the circuit, it then establishes the connectivity in step 712. For Example #2, the software routine 700 determines that Node 1 (N1) is the source for the start lead s and Node 2 (N2) is the destination for the finish lead f.

Next in step 714, the software routine 700 allocates space for displaying each winding in the drawing. In the embodiment of FIG. 6, the software routine 700 allocates 75% of the available vertical displayable space in the drawing window to the winding space 602. The horizontal display space 606 is then evenly distributed between all of the windings of the coil. The value of 75% is programmed into the software routine 700 based on actual coil designs. By allocating 75% of the vertical display for the windings, the software routine 700 is able to clearly display more complex coil designs containing multiple segments which may have multiple connections. In Example #2, the entire winding space 602 and the horizontal display space 606 is allocated for Winding 1 in step 714. The remaining 25% of available vertical space in the display window, by default, is allocated for the node display space 604.

Should there be more than one winding, the software routine 700 in step 714 allocates the horizontal display space 606 evenly between each of the windings. For instance, if a coil electrical design contained three windings, all three windings would be drawn in the winding space 602 but each winding would be allocated roughly 33% of the horizontal display space 606.

In step 716, the software routine 700 allocates space within the windings for the segments. The segments are overlaid on the winding in the drawing 600. For Example #2, there is only one segment S1. Because there is only one segment S1, the software routine 700 will allocate the entire segment space 608 (FIG. 6) to Segment S1. If multiple segments were defined in the winding, the segments would be evenly distributed within the winding.

The software routine 700 allocates space for the nodes in step 718. After determining the number of nodes and the connectivity, the software routine is ready to begin creating the drawing 600 in a document.

In step 720, the software routine 700 opens the document that will be populated with the transformer electrical circuit information. Similar to step 314 of FIG. 3, the software routine 700 may create the drawing 600 in a Word™ document, an Excel™ document, a Word Perfect™ document or a Power Point™ document. After the document is opened, the software routine 700 determines how large to make the drawing in step 722 based on the characteristics of the document, similar to step 316 of FIG. 3. For example, the drawing may be formatted to fit into a 400×400 pixel ActiveX window if it is imported into an 8½"×11" portrait oriented document.

After the drawing size has been determined in step 722, the software routine 700 begins to draw the components in the window 610 in step 724. The software routine 700 first draws the body of Winding 1 and then overlays the segment S1 on Winding 1. As discussed previously, the body of Winding 1 will encompass the entire winding space 602 of the drawing 600. The segment leads s and f of Winding 1 are attached to the segment S1. Finally the nodes N1 and N2 are added into the node space 604 and are connected by arrowed lines 612 depicting the flow of current to the leads s and f. When determining the position of the nodes N1 and N2, the software routine 700 positions them at the edges of the node space 604 as shown in FIG. 6. The nodes N1 and N2 are positioned at this location for ease of display. As additional nodes are added to the drawing, they are positioned across the horizontal display space 606 in a spatially uniform manner.

In step 726, the software routine 700 retrieves any textual information embedded within the phase circuit metadata file and displays the text in predetermined locations within the document. Some examples of text information include, but are not limited to, the winding name, the electrical characteristics of the winding, the winding material and so forth. After all of the information for the electrical characteristics have been inserted into the document, the document is closed in step 728. The software routine 700 ends at step 730.

Figure 8:
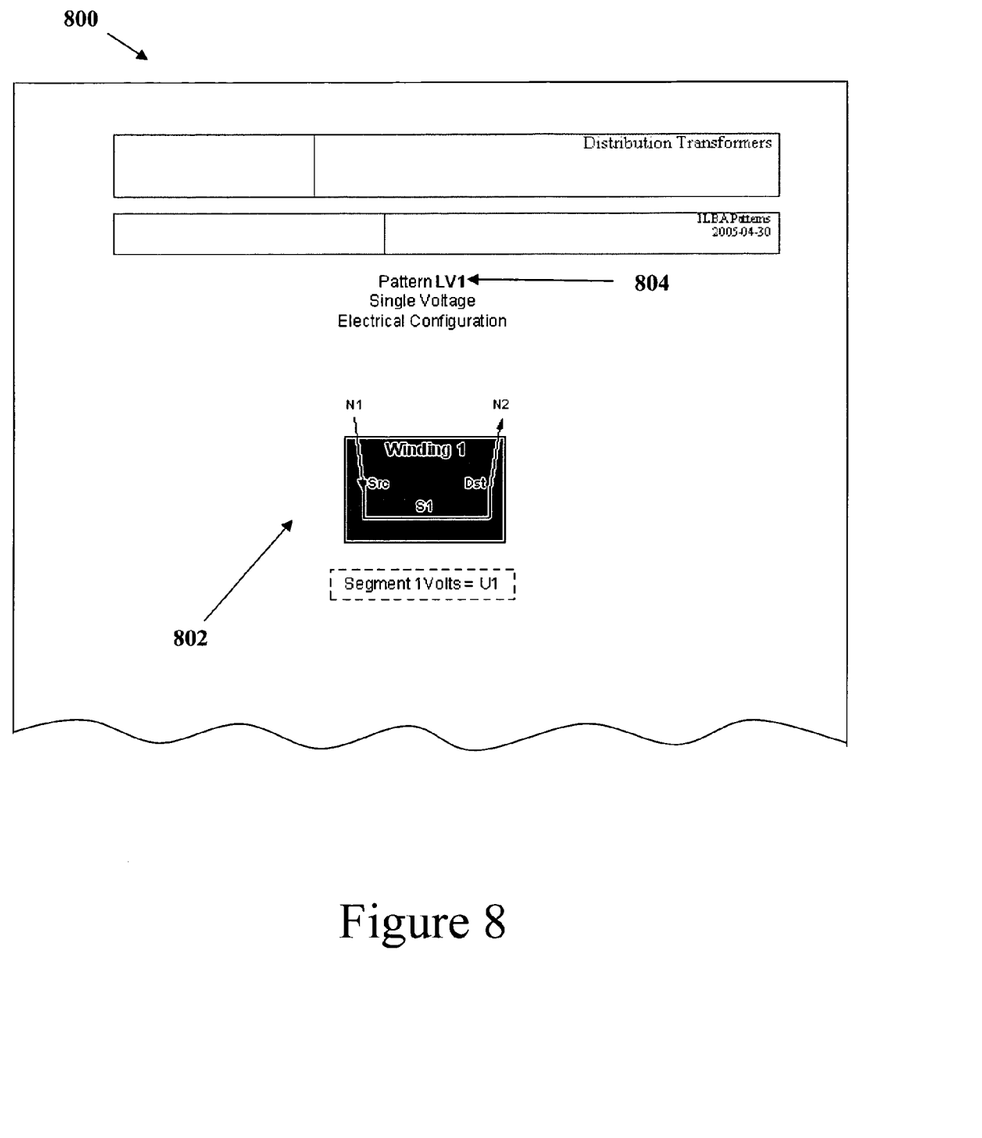
FIG. 8 illustrates a document populated with the electrical circuit information of a transformer coil.

FIG. 8 shows a page 800 of a document populated with the drawing 600 of FIG. 6. Within the page 800, the names displayed for the source lead s and finish lead f are "Src" and "Dst" respectively. In this case, the software routine 700 was programmed to substitute more descriptive names of the coil into the page 800. For further illustration, the name of the drawing "LV1" is extracted from the metadata file of Example #2 and inserted into the page of the document at location 804. The document containing the drawing page 800 of FIG. 8 may be the same document containing the physical drawing page 400 of FIG. 4.

It is to be understood that the foregoing description has been provided merely for the purpose of explanation and is in no way to be construed as limiting of the invention. Where the invention has been described with reference to embodiments, it is understood that the words which have been used herein are words of description and illustration, rather than words of limitation. Further, although the invention has been described herein with reference to particular structure, materials and/or embodiments, the invention is not intended to be limited to the particulars disclosed herein. Rather, the invention extends to all functionally equivalent structures, methods and uses, such as are within the scope of the appended claims. Those skilled in the art, having the benefit of the teachings of this specification, may effect numerous modifications thereto and changes may be made without departing from the scope and spirit of the invention in its aspects.

We claim:

1. A computer-implemented method of documenting a design of a transformer, the method comprising:

generating a metadata text file describing a physical layout of the transformer, the metadata text file being written in a metamarkup language and comprising component elements describing components of the transformer, respectively, the component elements being arranged in a hierarchical format that corresponds to the physical arrangement of the components in the transformer;

analyzing the metadata text file to determine design information comprising numbers and types of the components of the transformer and their interrelationship;

opening an electronic document; and creating a drawing of the physical layout of the transformer in the opened electronic document using the determined design information, the drawing including graphic elements representing the components of the transformer, respectively.

2. The method of claim 1, further comprising:

allocating space in the drawing for the graphic elements based on the number and the types of the components.

3. The method of claim 2, wherein the space is allocated based on the relative proportions of the corresponding components of the transformer.

4. The method of claim 3, further comprising retrieving characteristic data from the metadata text file and inserting the characteristic data into the opened electronic document, the characteristic data comprising performance characteristics of the components of the transformer.

5. The method of claim 4, wherein the characteristic data is inserted into the opened document in predetermined locations.

6. The method of claim 5, wherein the characteristic data comprises electrical tolerances.

7. The method of claim 5, wherein the characteristic data comprises insulation characteristics.

8. The method of claim 3, further comprising determining a size of the drawing based on the type of the opened electronic document.

9. The method of claim 1, wherein the opened electronic document is a Word document.

10. A computer-implemented method of documenting a design of a transformer, the method comprising:

generating a metadata text file describing a circuit layout of the transformer, the metadata text file being written in a metamarkup language and comprising component elements describing components of the transformer, respectively, the component elements being arranged in a hierarchical format that corresponds to different circuit levels of the circuit layout of the transformer;

analyzing the metadata text file to determine design information comprising numbers and types of the components of the transformer and their interconnectivity;

opening an electronic document; and creating a drawing of the circuit layout of the transformer in the opened electronic document using the determined design information, the drawing including graphic elements representing the components of the transformer, respectively.

11. The method of claim 10, further comprising:

allocating space in the drawing for the graphic elements based on the number and the types of the components.

12. The method of claim 10, further comprising retrieving characteristic data from the metadata text file and inserting the characteristic data into the opened electronic document, the characteristic data comprising performance characteristics of the components of the transformer.

13. The method of claim 12, wherein the characteristic data is inserted into the opened document in predetermined locations.

14. The method of claim 12, wherein the characteristic data comprises electrical characteristics of windings.

15. The method of claim 10, wherein the opened electronic document is a Word document.

* * * * *